United States Patent [19]
Kim et al.

[11] Patent Number: 5,696,566
[45] Date of Patent: Dec. 9, 1997

[54] LIQUID CRYSTAL DISPLAY AND A MANUFACTURING METHOD THEREOF

[75] Inventors: Sang-soo Kim, Seoul; In-sik Jang, Suwon; Dong-gyu Kim, Suwon; Jun-ho Song, Suwon; Woon-yong Park, Seoul, all of Rep. of Korea

[73] Assignee: Samsung Electronics Co., Ltd., Suwon, Rep. of Korea

[21] Appl. No.: 602,104

[22] Filed: Feb. 23, 1996

Related U.S. Application Data

[62] Division of Ser. No. 70,717, Jun. 1, 1993, Pat. No. 5,517,341.

[30] Foreign Application Priority Data

| Jun. 1, 1992 | [KR] | Rep. of Korea | 92-9510 |
| Sep. 7, 1992 | [KR] | Rep. of Korea | 92-16300 |
| Sep. 30, 1992 | [KR] | Rep. of Korea | 92-17901 |

[51] Int. Cl.$^6$ ............................................. G02F 1/1343
[52] U.S. Cl. ............................................. 349/39; 349/38
[58] Field of Search ..................... 349/38, 39, 44, 349/54, 55

[56] References Cited

U.S. PATENT DOCUMENTS

| 5,260,818 | 11/1993 | Wu | 359/59 |
| 5,285,301 | 2/1994 | Shirahashi | 359/87 |
| 5,339,181 | 8/1994 | Kim | 359/59 |
| 5,459,596 | 10/1995 | Ueda et al. | 359/59 |

FOREIGN PATENT DOCUMENTS

| 1-109327 | 4/1989 | Japan . | |
| 1216321 | 8/1989 | Japan | 359/59 |
| 1339171 | 12/1989 | Japan . | |
| 2-277027 | 11/1990 | Japan . | |
| 2278231 | 11/1990 | Japan | 359/87 |
| 3-59543 | 3/1991 | Japan . | |
| 3-114028 | 5/1991 | Japan . | |
| 4067020 | 3/1992 | Japan | 359/87 |

*Primary Examiner*—William L. Sikes
*Assistant Examiner*—James A. Dudek
*Attorney, Agent, or Firm*—Cushman Darby & Cushman, IP Group of Pillsbury Madison & Sutro LLP

[57] ABSTRACT

An active matrix-type liquid crystal display is described having, for each pixel, a first electrode for of a storage capacitor that is connected to a scanning signal line. The liquid crystal display can be repaired for disconnections and short inferiorities occurring in a crossing portion of scanning signal line. A redundancy correcting line connects the capacitor electrodes of adjacent pixels. Also described is a double scanning signal line. The embodiments using the redundant connecting line and double scanning signal line are both repairable using laser if imperfections exist. Thus, while maintaining high aperture and contrast ratios, the disconnections and shorts in the crossing portion of wirings can be minimized.

4 Claims, 7 Drawing Sheets

LIQUID CRYSTAL DISPLAY AND A MANUFACTURING METHOD THEREOF

This is a division of application Ser. No. 08/070,717 filed Jun. 1, 1993 now abandoned U.S. Pat. No. 5,517,341.

BACKGROUND OF THE INVENTION

The present invention relates to a liquid crystal display and a manufacturing method thereof, and more particularly to an active matrix liquid crystal display and a method for manufacturing thereof capable of reducing the occurrence of such defects as short circuits between a gate line and data line and fractures of the gate line.

The present invention is an improvement over the invention which is the subject matter of the present inventors' co-pending U.S. application Ser. No. 07/934,396 which was filed on Aug. 25, 1992, and is now U.S. Pat. No. 5,339,181, the disclosure of which is hereby incorporated into this application by reference.

In response to a demand for personalized, space-saving displays which serve as the interface between humans and computers (and other types of computerized devices), various types of flat screen or flat panel displays, including liquid crystal displays have been developed to replace conventional display devices, particularly the cathode-ray tube (CRT), which is relatively large and obtrusive.

Liquid crystal displays have a simple matrix form and an active matrix form, using an electro-optic property of the liquid crystal whose molecular arrangement is varied according to an electric field. In particular, the LCD in the active matrix form utilizes a combination of liquid crystal technology and semiconductor technology, and is recognized as being superior to CRT displays.

The active matrix LCDs utilize an active device having a non-linear characteristic in each of a plurality of pixels arranged in a matrix configuration, using the switching characteristic of the device to thereby control the movement of each pixel. One type of the active matrix LCDs embodies a memory function through an electro-optic effect of the liquid crystal. A thin film transistor (hereinafter referred to as a "TFT") having three terminals is ordinarily used as the active device. A thin film diode (TFD), for example, a metal insulator metal (MIM) having two terminals, can also be used. In the active matrix LCD which utilizes such active devices, pixels are integrated on a glass substrate together with a pixel address wiring, to thereby provide a matrix driver circuit, with the TFTs serving as switching elements.

However, in the active matrix LCD whose display has a large screen, to obtain a high definition image, the number of the pixels are increased such that the aperture ratio of the individual pixels is decreased, thereby concomitantly reducing the brightness of the LCD.

To obtain a uniform image with on the active matrix LCD, it is also necessary that the voltage of a first signal applied through a data line be held constant for a certain time until a second signal is received. Also, in order to improve the image quality of the display, a storage capacitor is formed parallel with a liquid crystal cell.

To overcome the above-described problems, there has been proposed an active matrix LCD which has an additional light shielding layer and an independently wired storage capacitor to improve the characteristics of the display (see "High-Resolution 10.3-in Diagonal Multicolor TFT-LCD," M. Tsumura, M. Kitajima, K.Funahata et al., *SID 91 DIGEST*, pp. 215–218).

In the active matrix LCD according to the above paper, to obtain a high contrast ratio and high aperture ratio, a double light shielding layer structure is formed and the storage capacitor is formed of an independent wire formed separately from the gate line.

In the structure of the above double light shielding layer, a first light shielding layer is formed on a front glass substrate on which a color filter is provided and a second light shielding layer is formed on a rear glass substrate on which the TFT is provided. The LCD having such a double light shielding layer structure exhibits an aperture ratio which is improved by 6–20% over the conventional LCD having only the first light shielding layer. Also, a common electrode of the storage capacitor utilizes aluminum for the gate electrode whose resistance is only one-tenth that of the chromium (Cr) that is typically used for the gate electrode. Thereby, propagation delay characteristics along the scan line are improved.

However, the reduced aperture ratio, due to the usage of an opaque metal (aluminum) for forming the electrodes of the storage capacitor associated with each pixel, requires a longer recovery time.

Moreover, the second light shielding layer requires additional process steps, which unduly increase the cost and complexity of the LCD manufacturing process.

FIG. 1 is yet another pixel layout of a conventional liquid crystal display that attempts to overcome the problems associated with the LCD described by Tsumura previously. In this layout, an additional storage capacitor is formed. FIG. 2 is a cross-sectional view taken along line II—II of FIG. 1.

In FIG. 1, a single pixel region and portions of adjacent pixels surrounding it are illustrated. In a whole LCD, rows of gate lines 1 and orthogonal columns of data lines 5a are arranged in a matrix configuration. Thus, a pixel is formed in the regions bounded by these two kinds of lines. In each pixel region, a storage capacitor C, a thin film transistor (TFT) switching device, a light transmissive portion (aperture area), a transparent pixel electrode 4 and a color filter layer 21 are provided. Gate line 1 and data line 5a are referred to as scanning signal line and display signal line, respectively.

As can be seen in FIG. 1, the first electrode 10 of each storage capacitor C is formed as a tab-like portion projecting into a respective pixel portion from the scanning signal lines 1. Similarly, the gate electrode G of each TFT is also formed as an integral tab-like portion projected into a respective pixel portion of the scanning signal lines 1 (in the opposite direction to the corresponding first electrode of a storage capacitor). Each TFT system comprises a semiconductor layer 3 formed over the gate electrode G, a right tab-like protruding portion of display signal line 5a (drain electrode) adjoining the left end of semiconductor layer 3, a source electrode 5b adjoining the right end of semiconductor layer 3 and transparent pixel electrode 4. Transparent pixel electrode 4 is comprised of a transparent conductive material such as indium tin oxide (ITO).

All of the scanning signal lines 1, display signal lines 5a, capacitors C, TFTs, and pixel electrodes 4 are formed as part of a multilayer structure formed on the inward surface of a rear glass substrate 100. FIG. 2 illustrates a cross section of the aperture area for a pixel.

The process for forming an LCD having an additional storage capacitor is explained in more detail as follows. First electrode 10 of each storage capacitor C and each scanning signal line 1 are simultaneously formed by appropriately patterning an opaque conductive material (e.g., comprised of aluminum, chromium, molybdenum, or tantalum) previously deposited on the inner surface of the rear glass substrate 100 using a conventional photolithography process. Thereafter, an insulating layer 2 is formed over the scanning signal lines 1, first electrode 10 of capacitor C and the exposed regions of the inner surface of the rear glass substrate 100 as shown in FIG. 2. Next, the display signal lines 5a and transparent pixel electrodes 4 are separately formed, e.g., by successive photolithography processes. Then, a protective layer 6 is formed over pixel electrodes 4, display signal lines 5a, and the exposed regions of insulating layer 2, to thereby complete the multilayer structure disposed on the inner surface of the rear glass substrate 100.

With reference to FIG. 2, the prior art active matrix LCD further includes a front glass substrate 101 having a multilayer structure formed on the inner surface thereof, and oriented parallel to the rear glass substrate 100. For example, a black matrix 20 for light shielding is formed on the inner surface of front glass substrate 101. Black matrix 20 is formed by appropriately patterning a light-shielding layer, using a conventional photolithography process, to define the aperture area occupying each pixel electrode 4. Thereafter, a color filter layer 21 is formed over the black matrix 20 and the exposed areas of the inner surface of the front glass substrate 101. The color filter layer 21 includes light transmissive portions 21a disposed in the aperture area. Next, a protective layer 22 is formed over the color filter layer 21. Then, a transparent electrode 23 is formed over protective layer 22, to thereby complete the multilayer structure provided on the inner surface of the front glass substrate 101.

A thin layer of liquid crystal is then sandwiched between the front glass substrate 101 and the rear glass substrate 100, in contact with transparent electrode 23 and protective layer 6. Subsequent well-known process steps, fix together the front glass substrate 101 and the rear glass substrate 100 and the liquid crystal is then injected and sealed within the cavity formed therebetween.

In the active matrix LCD of the additional capacitor-type described with reference to FIGS. 1 and 2, since first electrode 10 of the storage capacitor and scanning signal line 1 are simultaneously patterned using the same material, an additional process step is unnecessary. Accordingly, the process for making the active matrix LCD can be simplified. However, it should also be appreciated that this device also suffers from certain drawbacks as follows. Since the first electrode 10 of each storage capacitor C is made of an opaque metal, and overlaps a significant portion of its associated pixel electrode 4, the aperture area of each pixel is significantly reduced by the corresponding overlap area, thereby reducing the aperture ratio.

Moreover, since the display signal lines 5a and pixel electrodes 4 are formed together on the same insulating layer 2, they must be separated by a predetermined distance to achieve electrical isolation. This further reduces the aperture area of the LCD and thus lowers the contrast ratio and luminance of the LCD.

FIG. 3 is a layout of the pixel of a liquid crystal display which has an independently capacitor, but differs from the Tsumura device previously described. FIG. 4 is a cross-sectional view taken along line IV—IV of FIG. 3, and shows only the lower part of the liquid crystal of the liquid crystal display panel. Line reference numerals as those of FIG. 1 and FIG. 2 represent the same elements.

As shown in FIG. 3, independently wired storage capacitor C uses transparent conductive material such as an indium-tin oxide (ITO) instead of an opaque metal, e.g., aluminum, as used in the above-mentioned conventional TFT-LCD. The light shielding layer structure formed around transparent pixel electrode 4 is not illustrated in FIG. 3. FIG. 3 shows only a single pixel and portions of surrounding pixels, each pixel defined by intersection scanning signal lines 1 and display signal lines 5a. Independently wired storage capacitor C is separated from scanning signal lines 1, differently from the additional capacitor-type shown in FIG. 1, and connected with the capacitor C in the adjacent pixel by an independent wiring 11, formed as a different conductive layer.

As shown in FIG. 4, the LCD having the independently wired capacitor utilizes inversely staggered TFTs as switching devices. Each gate electrode G, which is formed as a tab-like portion projected into each pixel and projecting from one of the scanning signal lines 1 portion, each first electrode 10a of storage capacitor C and each independent wiring 11, which is an extension of the first electrode, are formed parallel to the rear glass substrate of the liquid crystal display panel. Next, after insulating layer 2, such as a silicon nitride (SIN), is formed on the front surface, a semiconductor layer 3 and a transparent pixel electrode 4 are formed in a predetermined pattern. Display signal lines 5a and a source 5b are then formed thereon. Subsequent processes steps are accomplished using conventional methods.

Since the liquid crystal display using the independently wired storage capacitor as shown in FIGS. 3 and 4 utilizes transparent ITO for forming first electrode 10a of storage capacitor C, the aperture area does not decrease by as much the area of the electrode. However, since a light shielding layer does not exist on the rear glass substrate of the liquid crystal display panel along the edge of the pixel electrode, the contrast ratio is reduced so much. Also, an additional process step for forming the first electrode 10a of storage capacitor C is required. (This process is performed by depositing an additional transparent conductive material such as ITO, which is different from the opaque conductive material of the scanning signal lines, and then etching the transparent conductive material.)

To improve the problems exhibited in the above-mentioned liquid crystal displays of the additional capacitor-type (FIG. 1) and that of the independently wired type (FIG. 3), the aforementioned U.S. Pat. No. 5,339,181 includes a storage capacitor which faces a corresponding transparent pixel electrode and encloses the transparent pixel electrode in a ring (see FIGS. 5 and 6 show the invention disclosed in U.S. Pat. No. 5,339,181). The same reference numerals as those of FIG. 1 or 4 represent the same components.

In a comparison to the devices of FIGS. 1 and 3, the active matrix LCD shown in FIG. 5 is manufactured using a conventional method. However, the layout of first electrode 10 of storage capacitor C associated with a pixel electrode 4 is arranged in the peripheral region of pixel electrode 4 to thereby increase the aperture ratio and contrast ratio of LCD. Specifically, the opaque metal layer from which the display signal lines 5a and the first electrodes 10 of storage capacitors C are formed is patterned in a manner such that the first electrodes 10 of storage capacitors C substantially surround their associated pixel electrodes 4 and, preferably, overlap only a peripheral edge portion thereof. As can be seen more clearly in FIG. 6 (taken along line VI—VI of FIG. 5), first electrode 10 of the capacitor C is disposed substantially beneath the matrix of black layer 20 provided on the inner surface of the front glass substrate 101, and does not extend into the envelope of the aperture area, thereby significantly increasing the aperture ratio compared with that of a conventional active matrix LCD.

Additionally, the first electrode 10 of each capacitor C formed along each corresponding pixel electrode 4 serves as an additional black layer, as illustrated in FIG. 6. That is, the first electrode 10 minimizes the amount of leak light passing through the aperture area of the front glass substrate 101 from the region of the liquid crystal located outside of the envelope of the aperture area.

In the conventional active matrix LCD depicted in FIG. 2, it can be seen that any extraneous light entering the front glass substrate 101 at an angle of incidence greater than $\theta_1$ is emitted through the aperture area of the front glass substrate 101. In the LCD of U.S. patent application Ser. No. 07/934,396, only extraneous light which enters the front glass substrate at an angle of incidence greater than $\theta_2$ is emitted through the aperture area of the front glass substrate as illustrated in FIG. 6. Excess light ("leak light") which strikes the front glass substrate whose angle is less than the angle of incidence $\theta_2$ is blocked by first electrode 10 of the adjacent storage capacitor. This LCD of FIG. 6 thus reduces the amount of leak light emitted through the aperture area of front glass substrate 101 by an amount which is proportional to the difference between $\theta_2$ and $\theta_1$, thereby significantly increasing the contrast ratio.

Although the liquid crystal display having the ring-type storage capacitor improves display characteristics, it can be difficult to manufacture. Due to the introduction of foreign matter or a weak insulating film at wiring crossings (the intersection of scanning signal lines 1 and display signal lines 5a), wiring fractures in scanning signal lines 1 and/or short circuits between scanning signal lines 1 and display signal lines 5a occur, to thereby significantly lower the yield of manufactured liquid displays.

SUMMARY OF THE INVENTION

It is a primary object of the present invention to provide a liquid crystal display to which defects such as wiring fractures of the scanning signal line at the intersection of the scanning signal lines and display signal lines can be corrected.

It is another object of the present invention to provide a liquid crystal display to which defects such as short circuits occurring at the intersection of the scanning signal lines and display signal lines can be corrected.

It is a further object of the present invention to provide a liquid crystal display that improves the aperture ratio.

It is a still further object of the present invention to provide a liquid crystal display that improves the contrast ratio.

It is yet another object of the present invention to provide a method for simply manufacturing the liquid crystal display of the present invention with a minimum number of process steps.

According to the present invention the liquid crystal display contains a plurality of pixel regions bounded by the crossed scanning signal lines and display signal lines. Each pixel region contains a first electrode, which helps to maintain electric charge within the pixel region, so that the liquid crystal maintains its orientation. The first electrode is patterned to surround the aperture area containing the liquid crystal material.

In a first embodiment of the invention, each row of adjacent first electrodes are electrically connected together with redundancy connecting conductors.

In a second embodiment, there are two pairs of scanning signal lines associated with each pixel and electrically connected to the first electrode.

In both embodiments, conventional processing techniques without additional process steps are needed. Furthermore, according to the method of the invention, a laser can be used to correct any short circuits or fractures of the digital signal lines and the scanning signal lines. Thus, the overall yield can be improved.

BRIEF DESCRIPTION OF THE DRAWINGS

Further features and advantages will become more apparent from the following and more particular description of the preferred embodiment of the invention as illustrated in the accompanying drawings in which the same reference characters generally refer to like parts throughout the views, and in which.

DESCRIPTION OF THE PREFERRED EMBODIMENT

Figure 7:
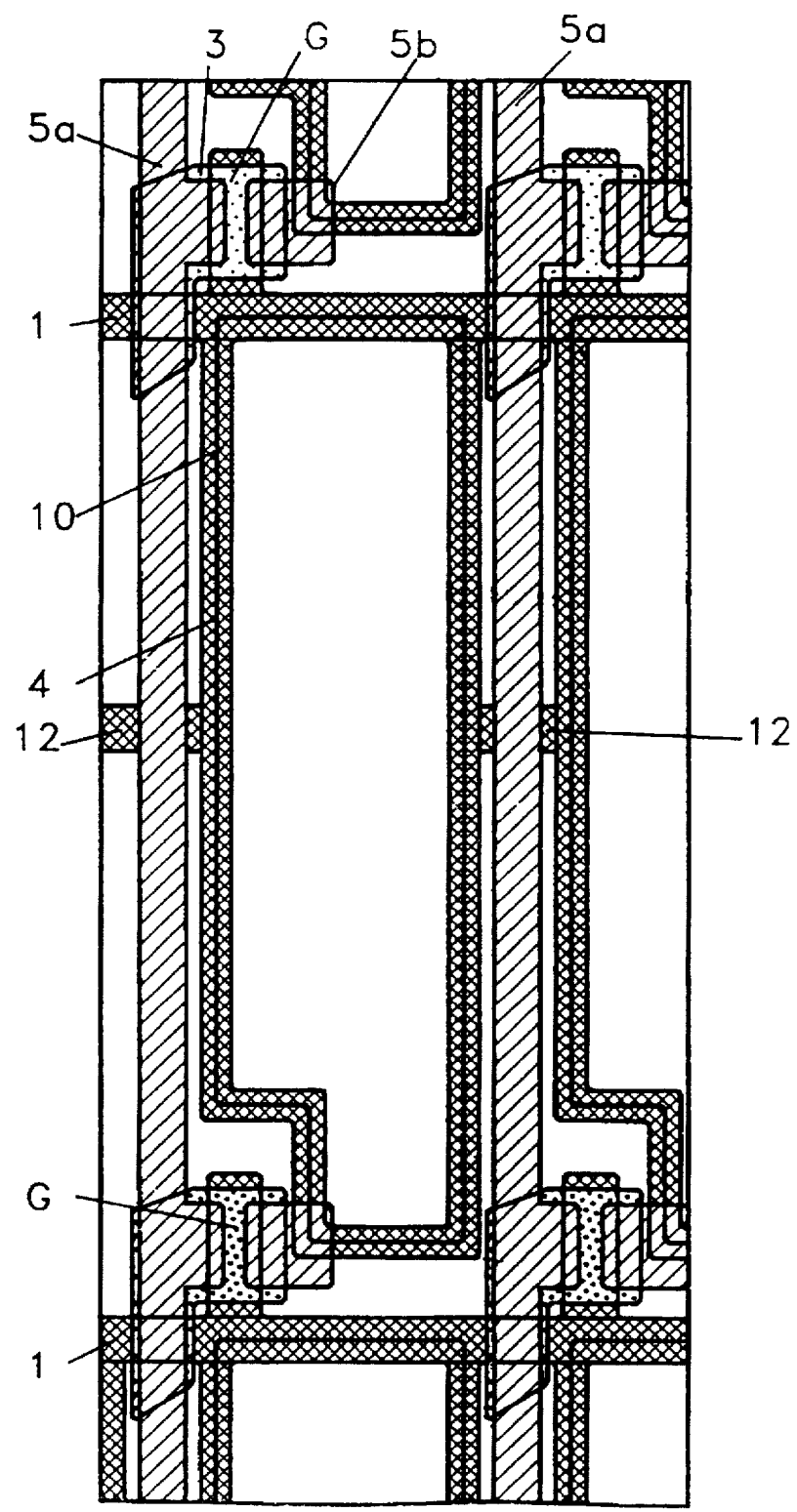
FIG. 7 is a pixel layout of the liquid crystal display according to the present invention wherein a ring-type storage capacitor having a redundancy connecting portion is formed.

FIG. 7 shows a pixel layout of a liquid crystal display according to one embodiment of the present invention.

Figure 5:
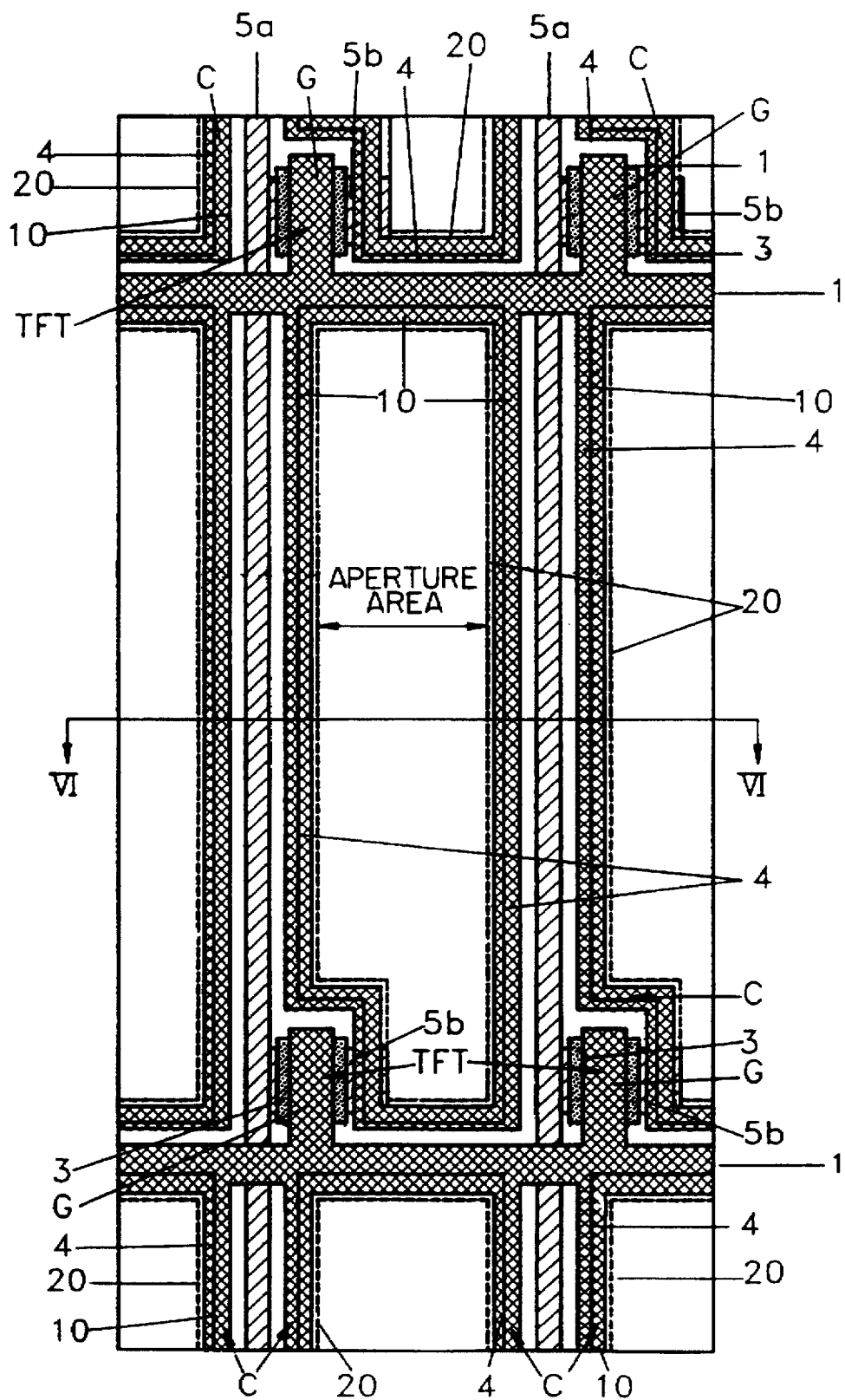
FIG. 5 is a pixel layout of the liquid crystal display wherein the additional capacitor-type storage capacitor is formed in a ring configuration.

Referring to FIG. 7, the liquid crystal display according to one embodiment of the present invention has a redundancy connecting portion 12 between a first electrode of a storage capacitor formed in each pixel region, in contrast to the pixel layout of the liquid crystal display shown in FIG. 5.

An opaque metal layer, from which the display signal line 5a and the first electrodes 10 of storage capacitors C are formed, is patterned so that the first electrodes 10 of storage capacitors C substantially surround their associated pixel electrodes 4 and, preferably, overlap only a peripheral edge portion thereof.

Figure 1:
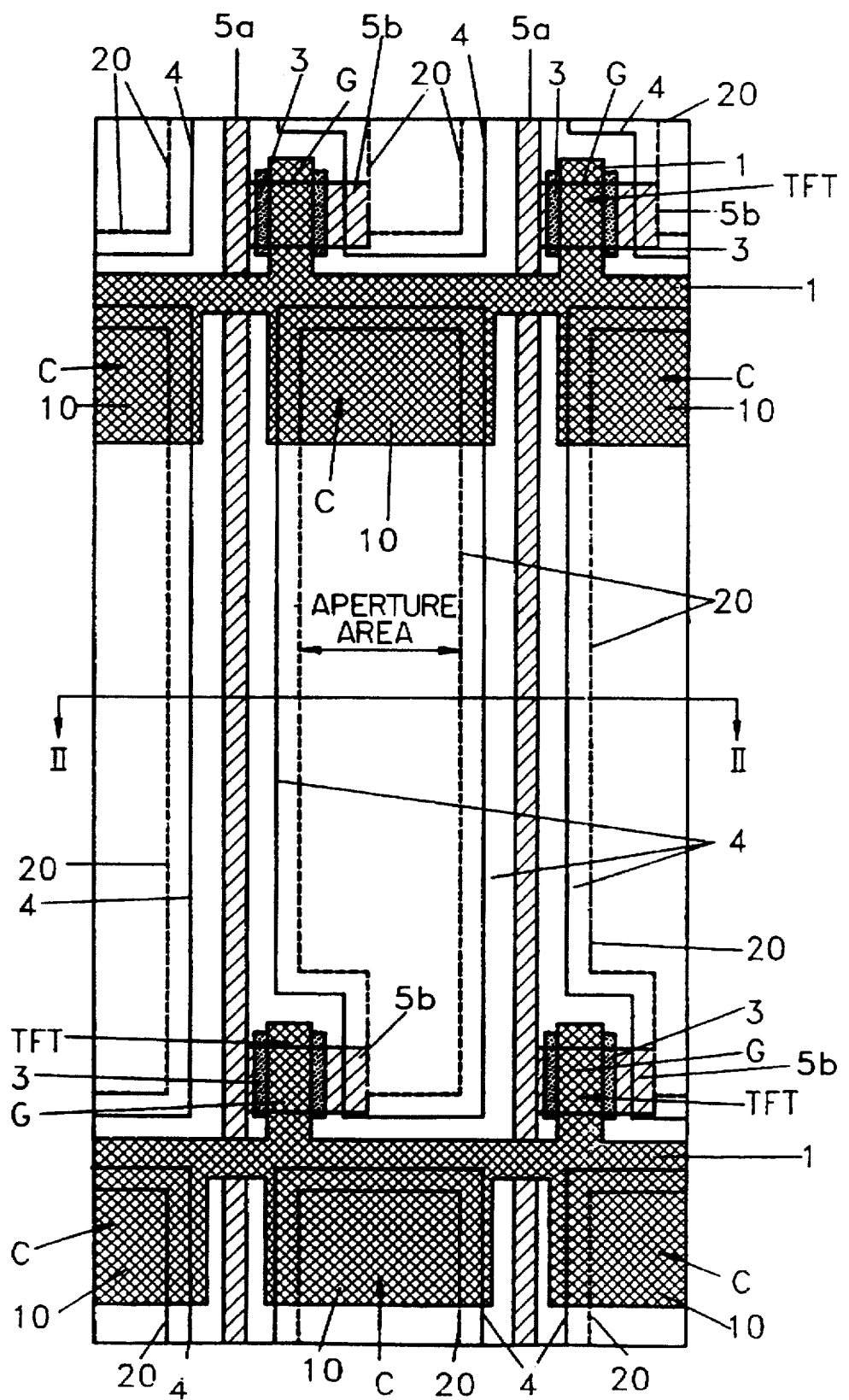
FIG. 1 is a pixel layout of the conventional liquid crystal display formed using an additional capacitor-type method.
Figure 2:
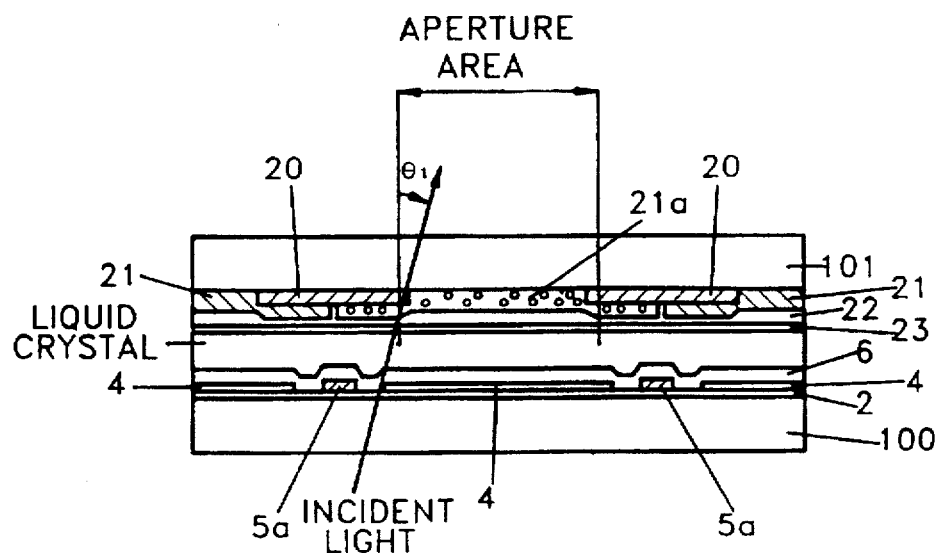
FIG. 2 is a cross-sectional view taken along line II—II of FIG. 1.
Figure 4:
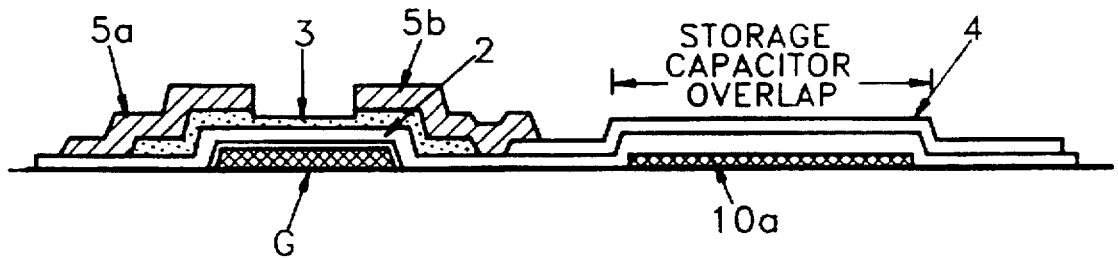
FIG. 4 is a cross-sectional view taken along line IV—IV of FIG. 3.
Figure 6:
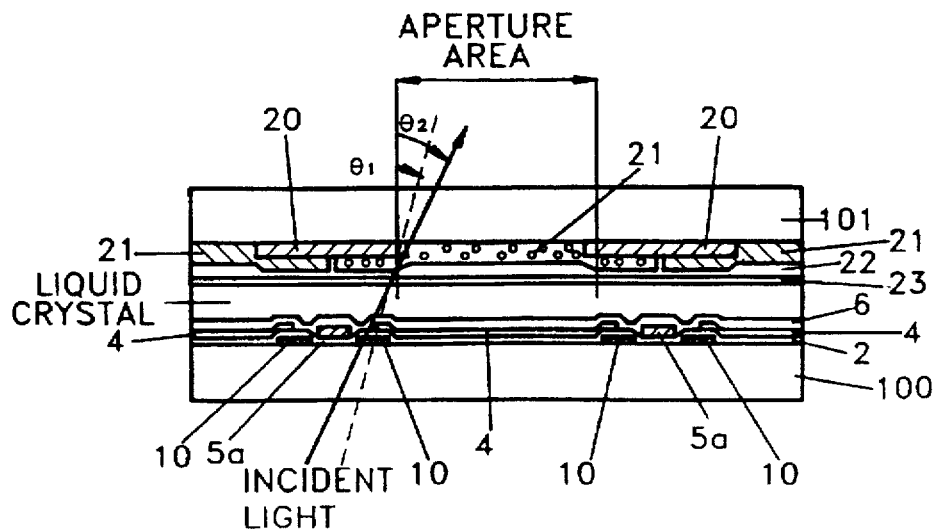
FIG. 6 is a cross-sectional view taken along line VI—VI of FIG. 5.
Figure 3:
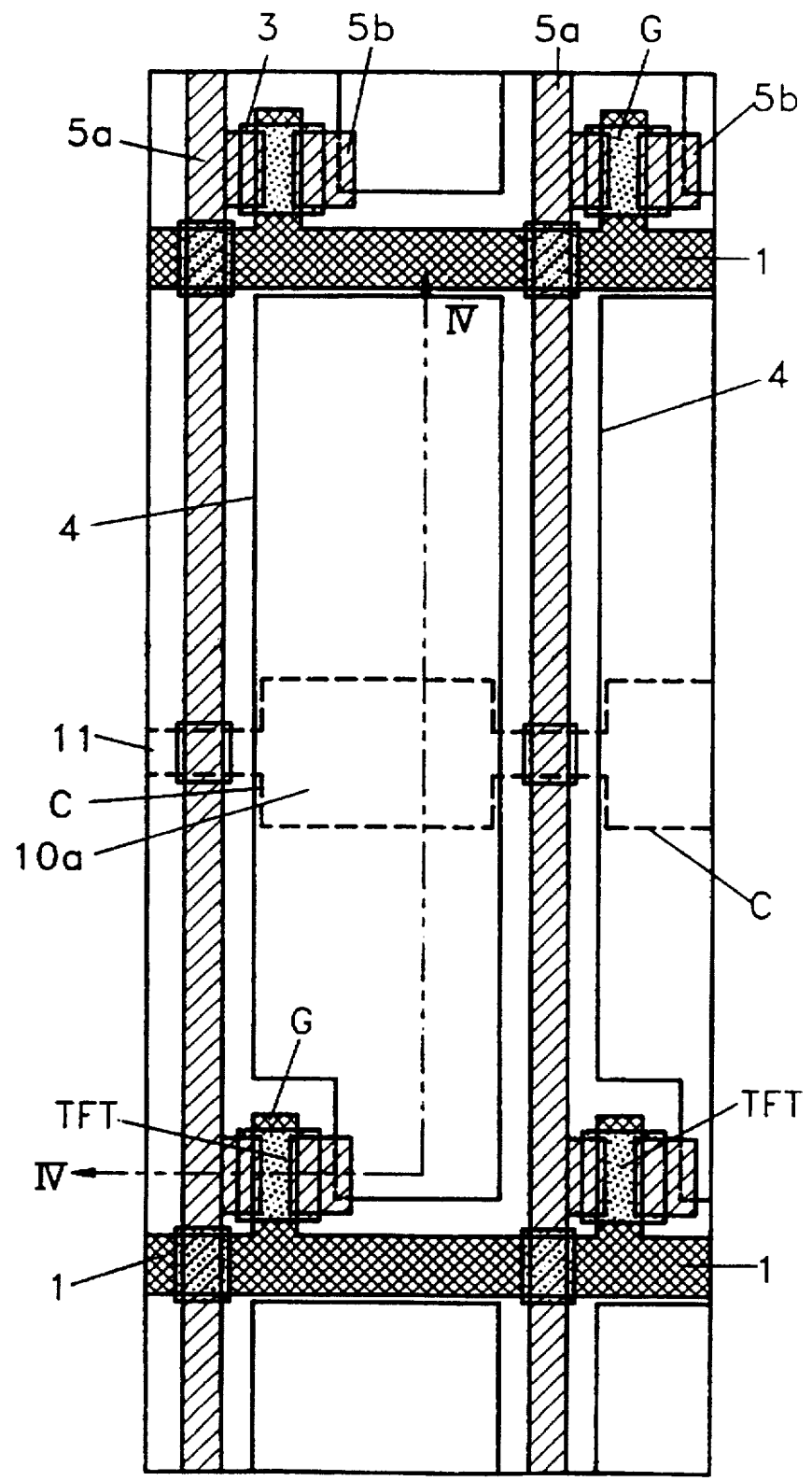
FIG. 3 is a pixel layout of the conventional liquid crystal display wherein an independent wiring-type storage capacitor is formed.

Moreover, first electrodes 10, like those shown in FIG. 6, are located under the matrix of black layer 20 provided on front glass substrate 101 and do not extend into the aperture area, thereby increasing the aperture ratio compared with the conventional LCD.

Additionally, first electrode 10 of each capacitor, which is formed to substantially surround each respective pixel electrode 4, serves as an additional light shielding layer. This minimizes the amount of leak light passing through the aperture area of the front glass substrate 101 from the regions of the liquid crystal located outside of the envelope of the aperture area.

Redundancy connecting portion 12, which is connected between the first electrodes 10 of each one of the storage capacitors, is simultaneously formed with first electrodes 10 and cross under display signal lines 5a. A dielectric insulating film is disposed in between connecting portions 12 and is tested, if it has a display signal line 5a.

When the liquid crystal display having the above-mentioned construction short circuit between the scanning signal line 1 and display signal line 5a at the wiring crossing portion, the scanning signal lines are cut by a laser beam on both sides of the crossing portion where the short-circuit has occurred, to thereby repair the short circuit. Thereafter, the signal which would have been transmitted by scanning signal lines 1 passes not through the cut scanning signal lines but through redundancy connecting portion 12. Moreover, since the signal is transmitted through redundancy connecting portion 12 when wiring fractures of scanning signal lines 1 occur at the crossing portion, flaws of this type are also repaired.

Figure 8:
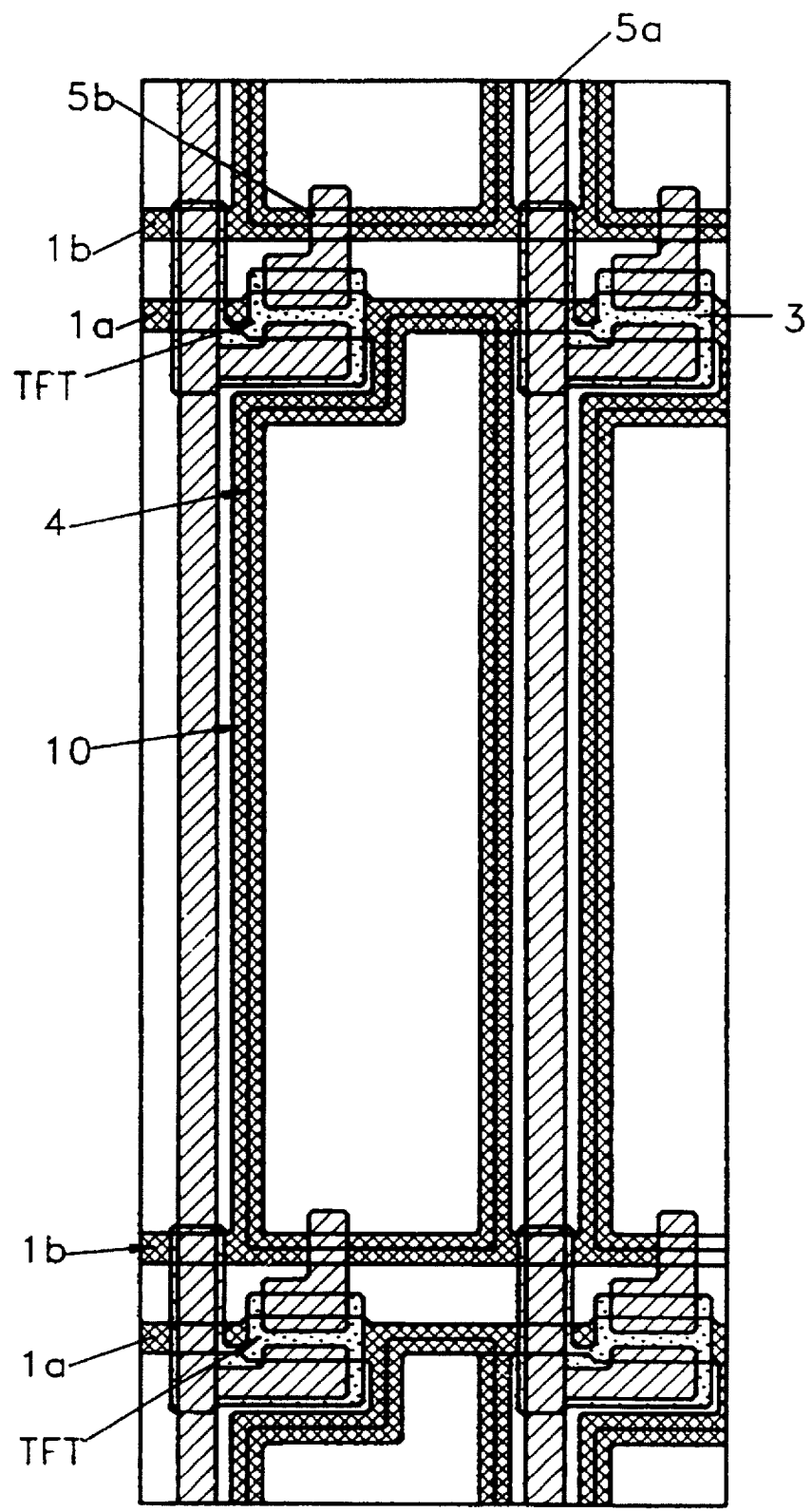
FIG. 8 is a pixel layout of the liquid crystal display according to the present invention wherein a storage capacitor is formed as a double wiring method of a ring-type.

FIG. 8 shows a pixel layout of the liquid crystal display according to another embodiment of the present invention.

Referring to FIG. 8, the scanning signal lines 1 are duplicated as first signal electrodes 1a and second scanning signal lines 1b, compared with the pixel layout of the liquid crystal display shown in FIG. 5. Each plurality of the scanning signal lines, constituted by the first scanning signal line 1a and the second scanning signal line 1b, is arranged at predetermined intervals. Thus, in the FIG. 8 embodiment, first and second scanning signal lines 1a and 1b and display signal line 5a form the pixel boundary.

The thin film transistor, is formed not on an integral tab-like portion of a corresponding scanning signal line 1a, but on the first scanning signal line 1a. Thus, the gate electrode of the thin film transistor is rotated 90° thereby to maximizing the aperture ratio of the liquid crystal display.

Meanwhile, an opaque conductive material layer from which the first electrodes 10 of storage capacitors C are formed, is patterned so that the first electrodes 10 of storage capacitors C substantially surround their associated pixel electrodes 4, overlap a peripheral edge portion thereof, and are connected with corresponding first and second scanning signal lines 1a and 1b on the same plane. When first electrode 10 is made of aluminum, the surface of the scanning signal lines and first electrode 10 is covered with aluminum oxide ($Al_2O_3$) by an anodizing method.

Meanwhile, all of first electrodes 10 of the storage capacitor, like those of the devices shown in FIG. 6, are disposed under the matrix of black layer 20 located on front glass substrate 101. This serves as an additional light shielding layer for directly preventing the transmission of back light, which prevents incident leak light, to thereby increase the contrast ratio. During the time the display signal voltage is supplied to pixel electrode 4 and the liquid crystal display panel is driven, a predetermined voltage is also supplied between the transparent common electrode, which is provided over the liquid crystal, and first electrode 10 of the storage capacitor, so that the liquid crystal molecules become arranged perpendicular with respect to the substrate. Thereby, leak light is interrupted to increase the contrast ratio when a normally white mode exists.

The transparent substrate for the lower panel of the liquid display is a glass substrate, for example, Corning 7059 (product's name), with a thickness of about 1.1 mm. The scanning signal line is doubled by first scanning signal line 1a and second scanning signal line 1b and is connected around the driving circuit by a single wiring. When the whole line width of the doubled-scanning line is the same as that of the scanning signal line in the conventional single wiring method, the area of each crossing portion of the scanning signal line and display signal line is consistent and there also is no change in the wiring resistance of the scanning signal line.

In this embodiment, the thin film transistor switching device, is formed in an inversely staggered configuration. Scanning signal line 1 serves as the gate electrode to maximize the pixel area. However, a thin film diode (TFD), for example, a metal insulator metal (MIM), having two terminals can be used as the switching device instead of the thin film transistor.

Figure 9:
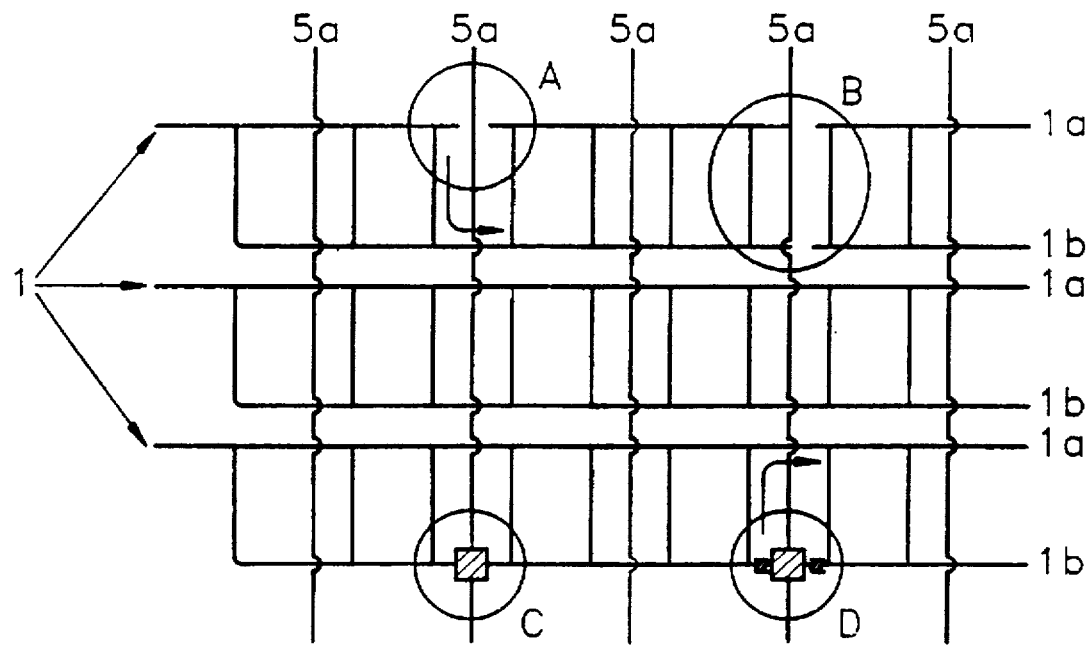
FIG. 9 is a schematic diagram showing an operational principle for explaining the effect of the present invention.

FIG. 9 is a schematic diagram showing operation of the present FIG. 8 embodiment.

Scanning signal line 1 is connected by a single wiring to the driving IC circuit. Lines 1a and 1b are the first and second scanning signal lines, respectively. An arrow designates signal current flow when only one of first and second scanning signal lines 1a and 1b are providing a current path. Display signal line 5a is perpendicular to the scanning signal lines. In a portion A, first scanning signal line 1a is disconnected at the crossing portion of the first scanning and display signal lines. In a portion B, both first and second scanning signal lines 1a and 1b are disconnected. In portion C, a short circuit occurs between the second scanning line 1b and display signal line 5a which is correctable by means of a laser beam, the short can be repaired since the scanning lines are doubled. Portion D shows the repaired state of the short in portion C.

That is, since only portion B is not correctable, the overall percentage of operative devices is significantly increased.

The process of manufacturing the liquid crystal display according to the present invention will be explained below.

First, aluminum is deposited to a thickness of not more than 4,000Å on the front surface of the rear glass substrate of the liquid crystal display. Scanning signal lines 1 and first electrodes 10 of the storage capacitors are then simultaneously formed.

First electrode 10 of the storage capacitor is formed with the ring-type structure, is extending to the edge of the pixel region, to enable utilization of the maximum pixel aperture area in both the embodiments of FIGS. 7 and 8. In making the FIG. 7 embodiment, redundancy connecting portion 12 is patterned to be connected between adjacent first electrodes 10 of the capacitors. In making the FIG. 8 embodiment, each paired scanning signal line is connected to each other.

In both the FIGS. 7 and 8 embodiments, since first electrode 10 serves as a light shielding layer, it should be comprised of an opaque conductive material that may be formed in a multilayer structure or by using an alloy.

When scanning signal lines 1 or first electrodes 10 is made of aluminum, using an anodic oxide method, the surfaces of the electrodes can be covered by the aluminum oxide film ($Al_2O_3$) whose thickness is not more than 2,000 Å, to enhance electrical characteristic.

Thereafter, a pad is formed thereon for bonding display signal line 5a and scanning signal line 1 to the driving circuit. Here, for example, chromium is used as the pad metal whose thickness is about 2,000 Å.

According to another embodiment of the present invention, after forming a pad on the glass substrate, scanning signal line 1 and first electrode 10 may be formed thereon using an opaque conductive material other than, but still including, aluminum. Then, using a chemical vapor deposition (CVD) method, an insulating layer of a silicon nitride (SiNx) and a semiconductor layer of an amorphous hydride silicon (a-Si:H) are deposited to thicknesses of about 3,000 Å or below and 2,000 Å or below, respectively. At this time, the a-Si:H doped in an N-type ($n^+$a-Si:H) is deposited as an ohmic layer on the a-Si:H to a thickness of approximately 500 Å. Thereafter, as shown in FIGS. 7 and 8, the semiconductor layer is patterned so as to define an area in which the switching device will be placed on scanning signal line 1 or its nearby portion.

The insulating layer on the connecting portion of the driving IC is removed, and a transparent conductive material, e.g., an ITO, is thereafter deposited to a thickness of about 500 Å or below via a sputtering method, and patterned to thereby form pixel electrode 4. At this time, pixel electrode 4 is patterned to overlap first electrode 10 of the storage capacitor by a predetermined width. A capacitor is thus formed between first electrode 10 of the storage capacitor and pixel electrode 4 on the pixel area with a dielectric insulating layer material in between, so that a voltage signal input through display signal line 5a is maintained for a predetermined time period till the following input.

Then, after the opaque corrective material such as chromium and aluminum are consecutively deposited on the whole surface of the substrate to a thicknesses of about 500 Å or below and 5,000 Å or below, respectively, via a sputtering method, display signal line 5a and source and drain electrodes of the TFT are patterned and a protective layer of silicon nitride is deposited on the whole surface of the substrate to a thickness of about 4,000 Å via a CVD method. Hence, the lower substrate of the LCD is completed. Using known LCD technology, an aligning layer for aligning the liquid crystal can be formed on the protective layer in a succeeding step.

The upper substrate of the LCD is completed so that, after the aperture area of the LCD has been defined, a light shielding layer is formed on the inner surface of the transparent front glass substrate as matrices along the periphery of each pixel area. The light shielding layer and exposed aperture area are then covered with a color filter layer, and an ordinary protective layer and transparent upper common electrode are successively formed thereon, thereby completing the multi-layer structure.

The above-described lower and upper substrates of the LCD are supported by supporting rods, and liquid crystal is injected between them. The substrate are then sealed, thereby completing the LCD.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A method for manufacturing a portion of a liquid crystal display comprising the steps of:

forming a first opaque conductive layer on a transparent substrate;

etching a plurality of scanning signal lines, including gate electrodes, first electrodes connected to said scanning signal lines and redundancy connecting conductors connecting adjacent first electrodes from said first opaque conductive layer;

forming a first insulator layer over said scanning signal lines, said first electrodes, said redundancy connecting conductors and exposed regions of said transparent substrate;

patterning a semiconductor layer to leave a plurality of channel regions;

forming a transparent conductive layer to form a pixel electrode; and forming a plurality of stripe shaped display signal lines, source electrodes and drain electrodes, said plurality of display signal lines patterned over said insulator layer and said semiconductor layer to form a plurality of pixel regions bounded by said scanning signal lines and said display signal lines, and said source and drain electrodes formed over ends of each channel region to obtain a plurality of thin film transistors, one thin film transistor within each pixel region.

2. A method for manufacturing a portion of a liquid crystal display according to claim 1 further comprising the step of isolating a shorted scanning signal line from a display signal line using a laser.

3. A method for manufacturing a portion of a liquid crystal display comprising the steps of:

forming a first metal layer on a transparent substrate;

patterning said first metal layer to form a plurality of scanning signal lines including paired of first and second scanning signal lines and first electrodes;

forming an insulating layer and a semiconductor layer over said paired first and second scanning signal lines, first electrodes and exposed regions of said transparent substrate;

patterning said semiconductor layer to obtain a plurality of channel regions;

forming a transparent conductive layer to form a pixel electrode; and forming a plurality of stripe shaped display signal lines, source electrodes and drain electrodes, said plurality of display signal lines patterned over said insulator layer and said semiconductor layer to form a plurality of pixel regions bounded by said first and second scanning signal lines and said display signal lines, and said source and drain electrodes formed over ends of each channel region to obtain a plurality of thin film transistors, one thin film transistor within each pixel region.

4. A method for manufacturing a portion of a liquid crystal display according to claim 3 further comprising the step of isolating a shorted scanning signal line from a display signal line using a laser.

* * * * *